(12) United States Patent
Stadler

(10) Patent No.: US 11,430,731 B2
(45) Date of Patent: Aug. 30, 2022

(54) SEMICONDUCTOR ARRANGEMENT AND METHOD FOR PRODUCING A SEMICONDUCTOR ARRANGEMENT

(71) Applicant: Infineon Technologies AG, Neubiberg (DE)

(72) Inventor: Michael Stadler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 43 days.

(21) Appl. No.: 16/794,922

(22) Filed: Feb. 19, 2020

(65) Prior Publication Data
US 2020/0266141 A1 Aug. 20, 2020

(30) Foreign Application Priority Data
Feb. 20, 2019 (DE) .......................... 102019104334.4

(51) Int. Cl.
| | | |
|---|---|---|
| *H01L 23/528* | (2006.01) | |
| *H01L 25/065* | (2006.01) | |
| *H01L 23/00* | (2006.01) | |
| *H01L 23/532* | (2006.01) | |

(52) U.S. Cl.
CPC ...... *H01L 23/528* (2013.01); *H01L 23/53214* (2013.01); *H01L 23/53228* (2013.01); *H01L 24/08* (2013.01); *H01L 24/32* (2013.01); *H01L 25/0657* (2013.01); *H01L 2224/04026* (2013.01); *H01L 2224/0807* (2013.01); *H01L 2224/32145* (2013.01)

(58) Field of Classification Search
CPC ............... H01L 23/528; H01L 25/0657; H01L 23/53258; H01L 24/32; H01L 24/08; H01L 23/53214; H01L 2224/04026
USPC .................................................. 257/739, 686
See application file for complete search history.

(56) References Cited

U.S. PATENT DOCUMENTS

| | | | |
|---|---|---|---|
| 2008/0237810 A1 | 10/2008 | Subramanian et al. | |
| 2011/0042797 A1 | 2/2011 | Park et al. | |
| 2014/0021627 A1* | 1/2014 | Kimura et al. | ......... H01L 24/71 257/773 |
| 2014/0048934 A1 | 2/2014 | Chen et al. | |
| 2015/0206868 A1 | 7/2015 | Zhang et al. | |
| 2019/0341345 A1* | 11/2019 | Nishida | ............. H01L 23/49844 |

FOREIGN PATENT DOCUMENTS

| | | |
|---|---|---|
| DE | 102004016940 A1 | 10/2005 |
| JP | 0745641 A | 2/1995 |

* cited by examiner

*Primary Examiner* — Thinh T Nguyen
(74) *Attorney, Agent, or Firm* — Murphy, Bilak & Homiller, PLLC

(57) ABSTRACT

A semiconductor arrangement includes a lower semiconductor chip, an upper semiconductor chip arranged over an upper main side of the lower semiconductor chip, a metallization layer arranged on the upper main side of the lower semiconductor chip, and a bonding material which fastens the upper semiconductor chip on the lower semiconductor chip. The metallization layer includes a structure with increased roughness in comparison with the rest of the metallization layer, the structure being arranged along a contour of the upper semiconductor chip.

13 Claims, 4 Drawing Sheets

SEMICONDUCTOR ARRANGEMENT AND METHOD FOR PRODUCING A SEMICONDUCTOR ARRANGEMENT

TECHNICAL FIELD

The present invention relates to a semiconductor arrangement and to a method for producing a semiconductor arrangement.

BACKGROUND

A semiconductor arrangement may, for example, be a semiconductor package which comprises more than one semiconductor chip, for example 2 semiconductor chips in mutually stacked arrangement. The stacked semiconductor chips may, for example, be a power semiconductor chip and an associated control chip. In this case, the upper semiconductor chip may be fastened by means of a bonding material such as an adhesive on an upper main side of the lower semiconductor chip. Depending on parameters such as the viscosity of the respective bonding material, the amount of bonding material deposited, etc., the upper semiconductor chip may "float" on the bonding material and thereby leave its intended position. This may have the effect that the upper semiconductor chip in the semiconductor arrangement causes a short circuit or cannot be electrically contacted correctly (for example since a wire bonding machine is not capable of reaching contacts of the upper semiconductor chip if the latter is not positioned correctly). Improved semiconductor arrangements, or improved methods for producing semiconductor arrangements, may assist in avoiding these and other problems.

SUMMARY

Some embodiments relate to a semiconductor arrangement, comprising, a lower semiconductor chip, an upper semiconductor chip, which is arranged over an upper main side of the lower semiconductor chip, a metallization layer, which is arranged on the upper main side of the lower semiconductor chip, and a bonding material, which fastens the upper semiconductor chip on the lower semiconductor chip, wherein the metallization layer comprises a structure with increased roughness in comparison with the rest of the metallization layer, wherein the structure is arranged along a contour of the upper semiconductor chip.

Some embodiments relate to a semiconductor arrangement, comprising, a lower semiconductor chip, an upper semiconductor chip, which is arranged over an upper main side of the lower semiconductor chip, a metallization layer, which is arranged on the upper main side of the lower semiconductor chip, and a bonding material, which fastens the upper semiconductor chip on the lower semiconductor chip, wherein the metallization layer comprises surface structuring having a plurality of depressions, wherein the surface structuring is arranged along a contour of the upper semiconductor chip.

Some embodiments relate to a method for producing a semiconductor arrangement, the method comprising providing a lower semiconductor chip, applying a metallization layer on an upper main side of the lower semiconductor chip, structuring the metallization layer, and fastening an upper semiconductor chip on the upper main side of the lower semiconductor chip by means of a bonding material, wherein the metallization layer is structured in such a way that it has an increased roughness along a contour of the upper semiconductor chip in comparison with the rest of the metallization layer, and wherein wetting of the upper main side of the lower semiconductor chip by the bonding material is limited by the structure to a region below the upper semiconductor chip.

BRIEF DESCRIPTION OF THE DRAWINGS

The appended drawings represent examples and serve together with the description to explain the main features of the disclosure. The elements of the drawings are not necessarily true to scale with respect to one another. References which are the same may denote parts which correspond to one another, while similar or identical.

In FIG. 3A, a bonding material has been deposited, and in FIG. 3B an upper semiconductor chip has been placed on the bonding material. FIG. 3C shows a case in which the bonding material flows on the metallization layer because of its low viscosity, while being restricted by the structure.

DETAILED DESCRIPTION

In the present description, the expressions "coupled" and/or "electrically coupled" are not intended to mean that the elements must be coupled directly; intermediate elements may be provided between the "coupled" or "electrically coupled" elements.

Semiconductor arrangements which contain a plurality of semiconductor chips will be described below. The semiconductor chips may be of different type, produced by different technologies and, for example, comprise integrated electrical, electro optical or electromechanical circuits and/or passive elements. The semiconductor chips may for example be configured as power semiconductor chips, for instance power MOSFETs (metal-oxide-semiconductor field-effect transistors), IGBTs (insulated gate bipolar transistors), JFETs (junction field-effect transistors), power bipolar transistors or microelectromechanical components. For example, there may be semiconductor chips with a vertical structure, that is to say the semiconductor chips can be produced in such a way that electrical currents can flow in a direction perpendicular to the main surfaces of the semiconductor chips. A semiconductor chip with a vertical structure may for example comprise contact elements on its two main surfaces, that is to say on its upper side and on its lower side. The semiconductor chips may also be produced from a specific semiconductor material, for instance Si, SiC, SiGe, GaAs or GaN.

The semiconductor chips may comprise electrodes (or contact positions or contact pads) which make it possible to establish an electrical contact with the integrated circuits contained in the semiconductor chips. One or more metal layers may be applied onto the electrodes of the semiconductor chips. The metal layers may be produced with any desired geometrical shape and any desired material composition. The metal layers may, for example, be in the form of a layer which covers a region. Any desired metal or any desired metal alloy may be used as the material, for example aluminum, titanium, gold, silver, copper, palladium, platinum, nickel, chromium or nickel-vanadium. The metal layers need not be homogeneous or be produced from only one material, that is to say various compositions and concentrations of the materials contained in the metal layers are possible. The electrodes may be located on the active main surfaces of the semiconductor chips.

The lower semiconductor chip described below may be placed on a system carrier (lead frame). The system carrier may have any desired shape and size, and may comprise any desired material. The system carrier may comprise a carrier (die pad) and connecting lines (leads). During production of the semiconductor arrangements, the carrier and connecting lines may be connected to one another. The carrier and the connecting lines may also be manufactured in one piece.

Figure 1A:
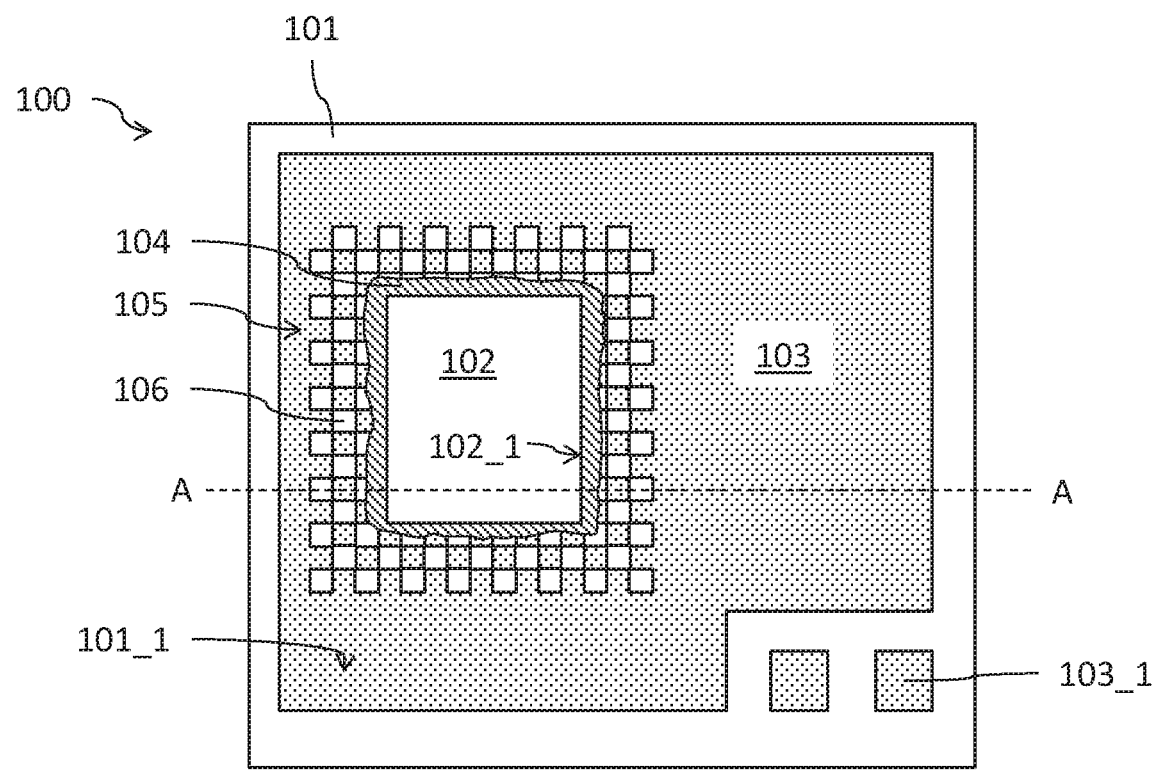
FIGS. 1A and 1B respectively represent a plan view (FIG. 1A) and a cross-sectional view (FIG. 1B) of a semiconductor arrangement having two semiconductor chips stacked on one another and a structured metallization layer.

FIG. 1A shows a plan view of one schematic example of a semiconductor arrangement 100. The semiconductor arrangement 100 comprises a lower semiconductor chip 101 and an upper semiconductor chip 102. The upper semiconductor chip 102 is arranged over an upper main side 101_1 of the lower semiconductor chip 101. A metallization layer 103 is arranged on the upper main side 101_1 of the lower semiconductor chip 101, i.e. between the lower semiconductor chip 101 and the upper semiconductor chip 102. The upper semiconductor chip 102 is fastened on the lower semiconductor chip 101 by means of a bonding material 104. The metallization layer 103 comprises a structure 105 with increased roughness, in other words a surface structure having a plurality of depressions, which is arranged along a contour 102_1 of the upper semiconductor chip 102.

The term "roughness" is in this case intended, in particular, to mean a structured surface in the metallization layer 103, which comprises a predefined pattern. Such roughness or surface structuring may influence the wetting behavior of a liquid (e.g. of a bonding material 104) deposited on the metallization layer for example by increasing the contact angle. In particular, it is in this way possible to prevent the liquid from spreading over the region with the increased roughness.

The lower semiconductor chip 101 may, for example, be a power semiconductor chip which is configured to be operated with high voltages and/or high currents. The lower semiconductor chip 101 may, for example, be a FET or an IGBT. The lower semiconductor chip 101 may comprise a vertical transistor structure with a first power electrode on the upper main side 101_1 and a second power electrode on an opposite lower main side. The first power electrode may, for example, be a source electrode or an emitter electrode. The second power electrode may, for example, be a drain electrode or a collector electrode. According to one example, however, it is also possible for the aforementioned electrodes to be arranged on the respective opposite main sides of the lower semiconductor chip 101. The lower semiconductor chip 101 may comprise further electrodes, for example a gate electrode or a ground electrode. These may, for example, be arranged on the upper main side 101_1.

The upper semiconductor chip 102 may, for example, be a driver chip which is configured to control the lower semiconductor chip 101. The upper semiconductor chip 102 may, for example, be connected by conductive connections, for instance bond wires, to the lower semiconductor chip 101 (this is not shown in FIG. 1A). The upper semiconductor chip 102 may have lateral dimensions which are signifi-cantly smaller than lateral dimensions of the lower semiconductor chip 101, for example approximately half as great or even smaller. According to one example, the upper semiconductor chip 102 comprises electrical connections only on an upper main side, i.e. facing away from the lower semiconductor chip 101. A lower main side of the upper semiconductor chip 102, which faces toward the lower semiconductor chip 101 may be free of electrical connections.

The bonding material 104 may be an adhesive, for example an electrically nonconductive adhesive. The bonding material 104 may cover the lower main side of the upper semiconductor chip 102 fully or at least partially, and it may electrically insulate the two semiconductor chips 101, 102 from one another. The bonding material 104 may protrude beyond a contour 102_1 of the upper semiconductor chip 102, as is shown in FIG. 1A. The bonding material 104 may be deposited on the upper main side 101_1 of the lower semiconductor chip 101 by means of a suitable deposition method. For example, one or more drops of the bonding material 104 may be deposited on the upper main side 101_1 by a dispenser.

The bonding material 104 may have a high viscosity or a low viscosity. "High viscosity" may mean here that a drop of the bonding material 104 deposited on the upper main side 101_1 does not flow or flows only to a small extent (i.e. substantially retains its shape) after being deposited. "Low viscosity" may mean here that a drop of the bonding material 104 deposited on the upper main side 101_1 is inclined to flow (i.e. does not substantially retain its shape) after being deposited.

After the deposition of the bonding material 104, the upper semiconductor chip 102 is placed thereon. Subsequently, the bonding material 104 may be cured, for example by application of heat in an oven. Before the curing, the upper semiconductor chip 102 is held in position only by the viscosity, or by a surface tension exerted by the bonding material 104. For the case in which a bonding material 104 with a low viscosity is used in the semiconductor arrangement 100, the upper semiconductor chip 102 may "float" away from the intended position if the low-viscosity bonding material 104 has flowed on the upper main side 101_1.

If the actual position of the upper semiconductor chip 102 differs excessively from its intended position after the curing of the bonding material 104, connections on the upper semiconductor chip 102 may possibly not be reached by a wire bonding apparatus. Moreover, an electrical short circuit can possibly be caused by the upper semiconductor chip 102 which has been pushed into position. The structure 105 may contribute to avoiding these problems, as will be described in more detail below.

The metallization layer 103 may be a metallization of an electrode (in particular a power electrode) of the lower semiconductor chip 101. The metallization layer 103 may comprise or consist of any one or more suitable metals or metal alloys, for example Al, Ag, Cu or Ti. The metallization layer 103 may be produced by using a sputtering process. The metallization layer 103 may also be arranged below a lower main side of the upper semiconductor chip 102. The bonding material 104 may electrically insulate the upper semiconductor chip 102 from the metallization layer 103. The metallization layer 103 may furthermore comprise one or more additional contact regions 103_1, which are for example configured to provide a gate terminal or a ground terminal of the lower semiconductor chip 101.

The structure 105 in the metallization layer 103 may fully enclose the upper semiconductor chip 102 (as shown in FIG.

1A), or it may be arranged only along one side or only along two sides (for example in an L-shape) or along three sides of the upper semiconductor chip 102 (for example in a U-shape). The structure 105 may protrude into a region inside the contour 102_1 of the upper semiconductor chip 102, or it may be arranged entirely outside the contour 102_1.

The structure 105 may comprise a plurality of depressions 106, which are formed in the metallization layer 103. The depressions 106 may be arranged in a matrix. The depressions 106 may, for example, be produced in the metallization layer 103 by an etching process. The depressions 106 may be holes which extend fully through the metallization layer 103.

According to one example, the metallization layer may have a thickness in the range of from 1 µm to 100 µm, particularly in a range of from 2 µm to 30 µm, or in a range of from 5 µm to 20 µm. The metallization layer may, in particular, have a thickness of about 10 µm. All the depressions 106 may have identical dimensions. The depressions 106 may, however, also have different dimensions, and for example depressions 106 that are arranged closer to the upper semiconductor chip 102 may have different dimensions than other depressions 106 that are arranged further away from the upper semiconductor chip 102. The depressions 106 may have an edge length, or a diameter, in a range of from 0.05 mm to 0.5 mm, for example about 0.1 mm.

The structure 105 may substantially have a checkerboard pattern, as shown in FIG. 1A (in other words, the depressions 106 may be arranged in a checkerboard pattern). The structure 105 may, however, also have another suitable pattern, for example a pattern of circular depressions, triangular depressions, etc.

Figure 1B:
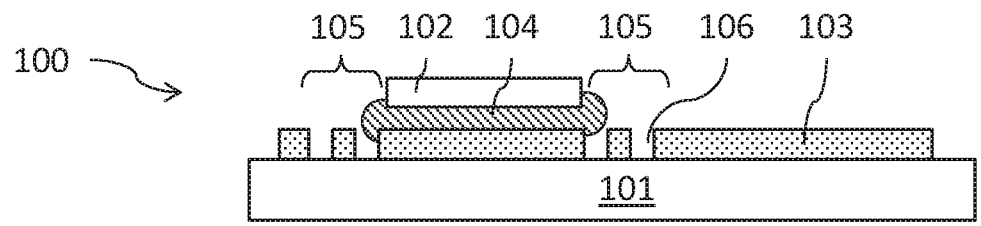

FIG. 1B shows a cross section through the semiconductor arrangement 100 along the line A-A in FIG. 1A. As shown in FIG. 1B, the metallization layer 103 may extend below a region below the upper semiconductor chip 102. The bonding material 104 may then entirely fill the region below the upper semiconductor chip 102, and it may protrude laterally beyond a contour of the upper semiconductor chip 102. As may be seen in FIGS. 1A and 1B, the structure 105 constitutes a region with an increased roughness in comparison with the rest of the metallization layer 103. This increased roughness may prevent (for example by an increase in the contact angle) the bonding material 104 being able to flow out from the region inside the structure 105 after application.

The semiconductor arrangement 100 may comprise a carrier, for example a part of a lead frame, on which the lower semiconductor chip 101 is arranged and optionally also electrically connected thereto. A power terminal of the semiconductor arrangement 100 may be arranged next to the upper semiconductor chip 102 on the metallization layer 103 and be electrically connected to the latter. The semiconductor arrangement 100 may furthermore comprise a molded body, which encapsulates the lower semiconductor chip 101 and the upper semiconductor chip 102.

Figure 2:
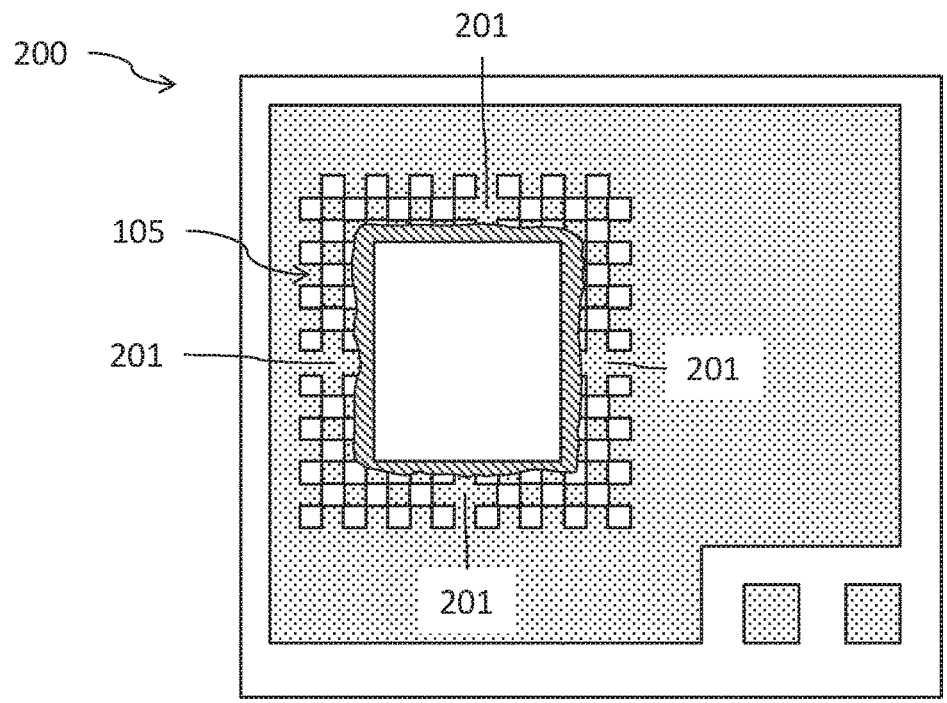
FIG. 2 shows a plan view of a further semiconductor arrangement, in which the structure comprises dedicated current paths.

FIG. 2 shows a further semiconductor arrangement 200, which may be identical to the semiconductor arrangement 100 apart from the differences mentioned below.

A structure 105 with a pattern, for example the checkerboard pattern shown in FIG. 1A, may lead to a region of the metallization layer 103 directly below the upper semiconductor chip 102 (i.e. inside the structure 105) and a region outside the structure 105 not being electrically connected to one another, or being electrically connected to one another only poorly. It may, however, be desired for the regions of the metallization layer 103 inside and outside the structure 105 to be electrically connected to one another. The structure 105 may therefore be configured in such a way that current paths lead through the structure 105 and connect these regions to one another.

In the example of FIG. 2, the structure 105 comprises dedicated current paths 201. The current paths 201 may have any desired suitable shape and arrangement. The current paths 201 should, however, be configured in such a way that they do not negate the intended effect of the structure 105 (of preventing the upper semiconductor chip 102 from floating away from its intended position).

Figure 3A:
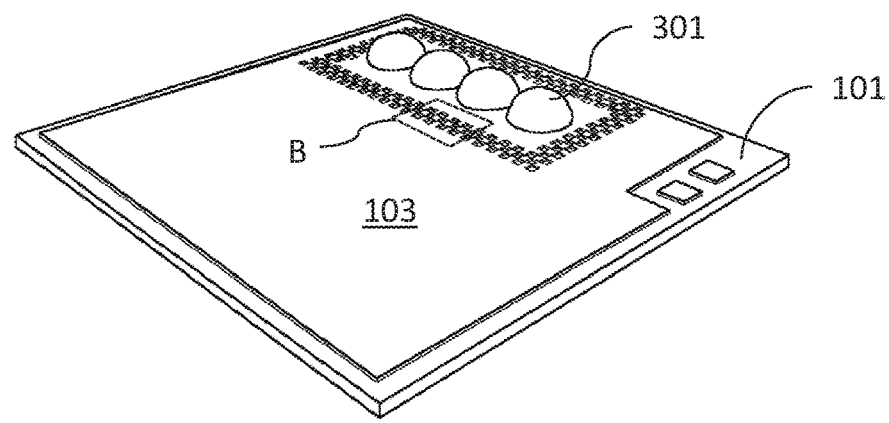
FIGS. 3A to 3C respectively show a perspective view of a semiconductor arrangement at various stages of production.
Figure 3B:
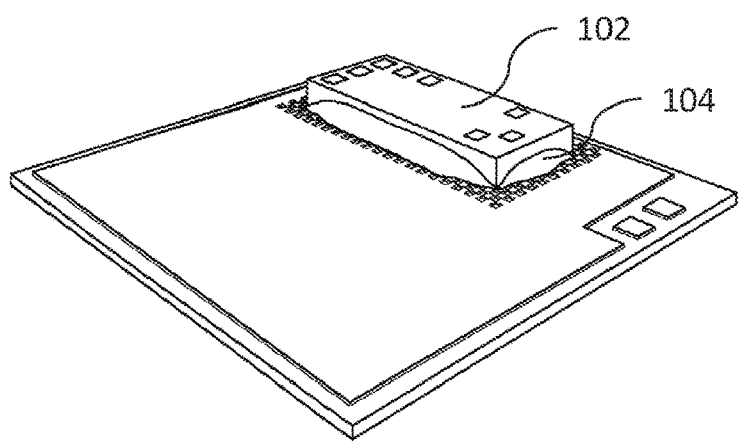

FIGS. 3A and 3B show a semiconductor arrangement 100 or 200 at various stages of manufacture according to one example of a method for producing a semiconductor arrangement.

FIG. 3A shows a stage in which the bonding material 104 has been deposited on the lower semiconductor chip 101 (in particular the metallization layer 103). In particular, individual drops 301 of the bonding material 104 may be deposited next to one another. FIG. 3B shows a stage after the upper semiconductor chip 102 has been placed on the bonding material 104. Because of the weight of the upper semiconductor chip 102, or because of the pressure exerted by a placing device, the bonding material 104 may be pressed out laterally below the upper semiconductor chip 102. However, the structure 105 prevents the bonding material 104 from spreading over a significantly large area, as already explained above. This may, for instance, be achieved by the contact angle between the bonding material 104 and the metallization layer 103 being increased by the structure 105, which reduces the wettability of the metallization layer 103 in the region of the structure 105.

Figure 3C:
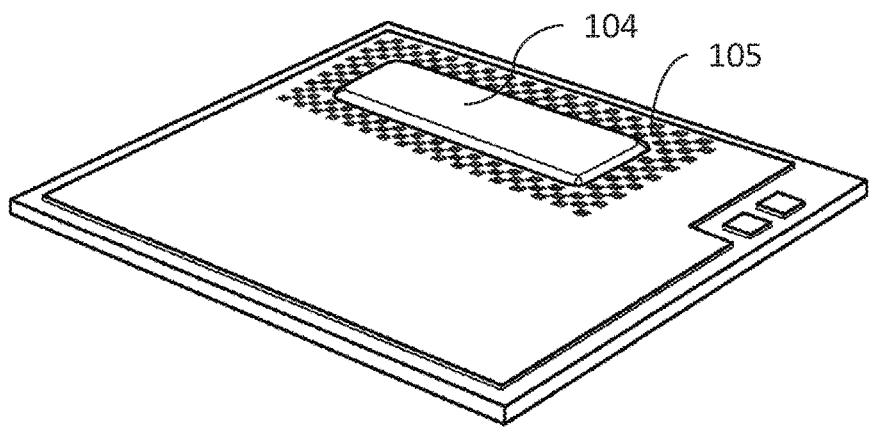

In the example of FIG. 3A, it is shown that the bonding material 104 is in the form of individual drops 103 after being deposited. Depending on the viscosity or hydrophilicity of the bonding material 104 respectively used, however, it may be that the drops 301 coalesce after being deposited and, for example, wet the entire region of the metallization layer 103 inside the structure 105. FIG. 3C shows an example in which this is the case. However even in this case the bonding material 104 cannot overcome the region with the structure 105.

Figure 4A:
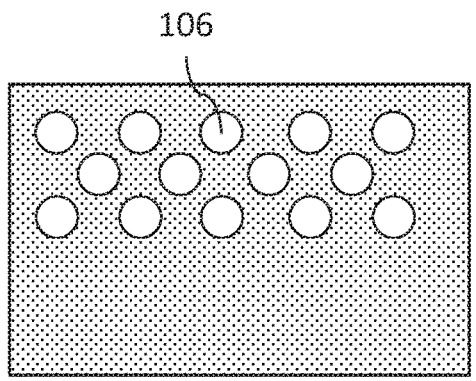
FIGS. 4A to 4D show various possible forms of depressions of the structure.
Figure 4B:
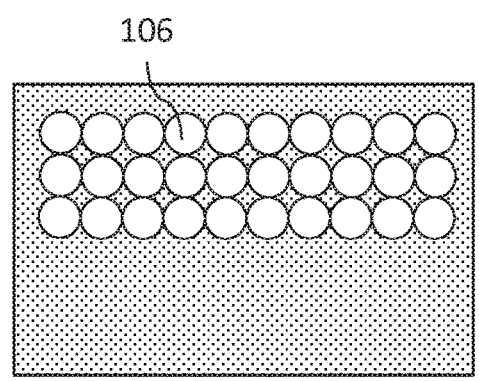

In a plan view of the detail B in FIG. 3A, FIGS. 4A-4D show examples of alternative patterns which may be used instead of the checkerboard pattern in the structure 105. As respectively shown in FIGS. 4A and 4B, the structure 105 may, for example, comprise a pattern of circular depressions or holes 106. The depressions 106 may be arranged at a distance from one another, as shown in FIG. 4A. In this way, current paths may be formed between the region inside the structure 105 and the region outside the structure 105. The depressions 106 may, however, also be arranged in such a way that adjacent depressions 106 touch (cf. FIG. 4B).

Figure 4C:
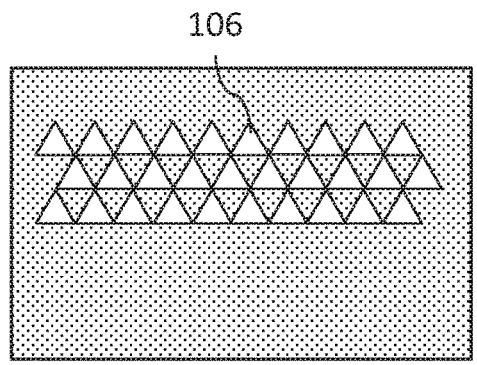
Figure 4D:
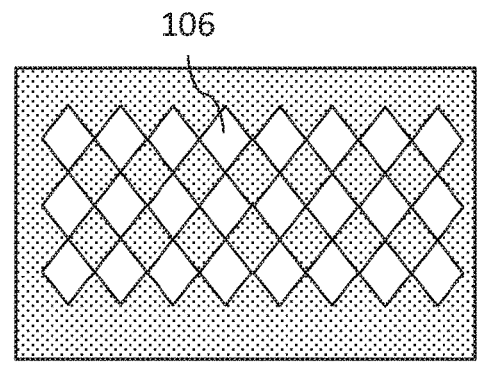

Further possible shapes of the depressions are for example triangular depressions 106 as shown in FIG. 4C, or rhombic depressions 106 as shown in FIG. 4D. The apices of the triangular depressions 106 may point away from the upper semiconductor chip 102, or they may also point toward the upper semiconductor chip.

Figure 5:
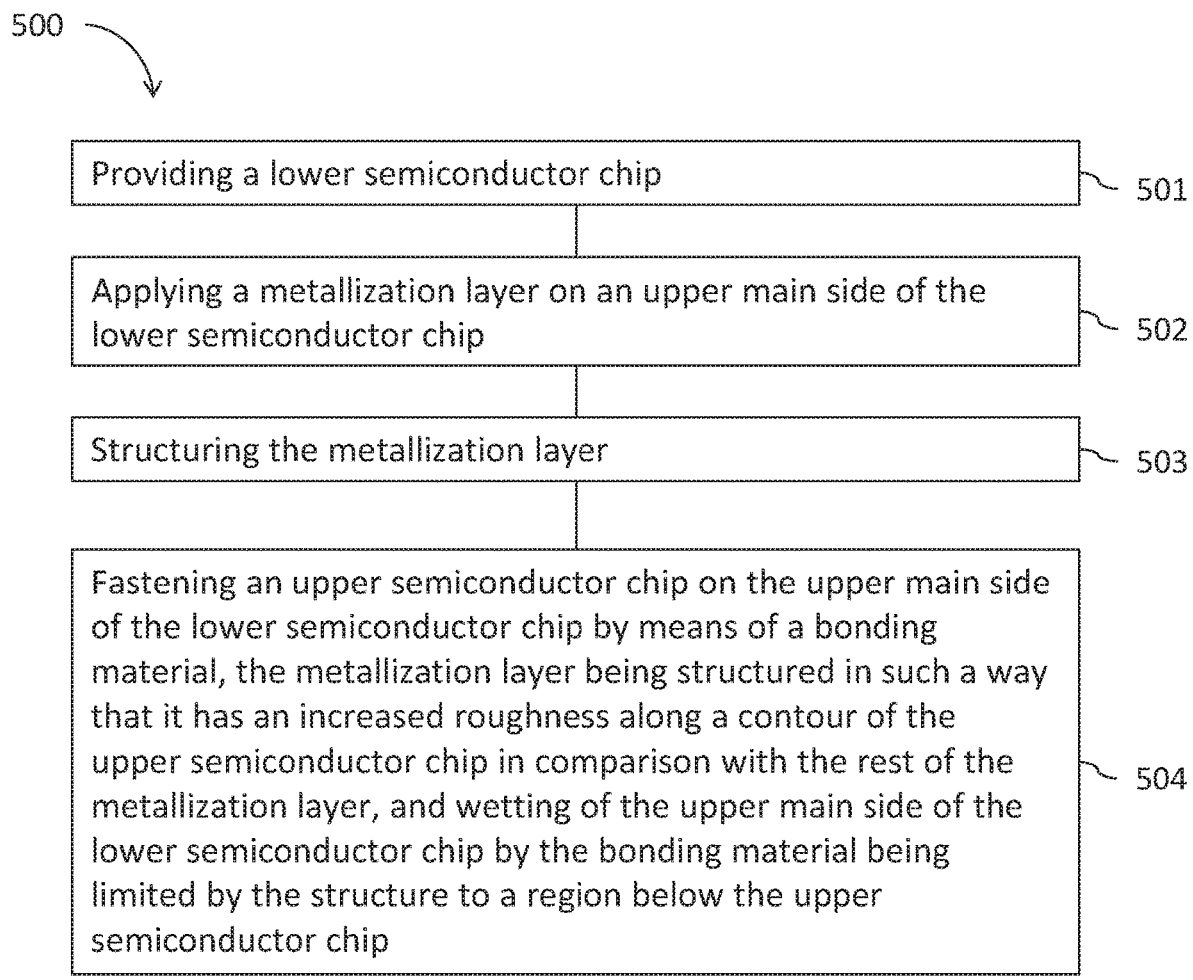
FIG. 5 is a flowchart of a method for the production of a semiconductor arrangement.

FIG. 5 shows a flowchart of a method for producing a semiconductor arrangement. The method 500 may, for example, be used in order to produce the semiconductor arrangements 100 or 200.

The method 500 comprises at 501 providing a lower semiconductor chip, at 502 applying a metallization layer on an upper main side of the lower semiconductor chip, at 503 structuring the metallization layer, and at 504 fastening an upper semiconductor chip on the upper main side of the lower semiconductor chip by means of a bonding material, the metallization layer being structured in such a way that it has an increased roughness along a contour of the upper semiconductor chip in comparison with the rest of the metallization layer, and wetting of the upper main side of the lower semiconductor chip by the bonding material being limited by the structure to a region below the upper semiconductor chip.

The method 500 may furthermore comprise sputtering in order to apply the metallization layer 103. After the application of the metallization layer 103, photoresist may be applied for photolithographic structuring of the metallization layer 103. In this case, the metallization layer 103, covered by the structured photoresist, may be etched (in particular wet-chemically etched). The structure 105 and optional further structures may therefore be produced together in the metallization layer 103.

According to the method 500, the fastening of the upper semiconductor chip 102 may comprise applying the bonding material 104 on the upper main side 101_1 by drop application. The drop or drops of the bonding material 104 may be applied in such a way that flowing of the drop or drops of the bonding material 104 is restricted by the structure 105 in the metallization layer 103, as already explained above.

According to the method 500, the bonding material 104 may be cured after fastening the upper semiconductor chip 102, for example by means of heating in an oven. During the curing, the upper semiconductor chip 102 may be fixed in its position by a surface tension exerted by the structure 105 on the bonding material 104.

The semiconductor arrangement and the method for producing a semiconductor arrangement will be explained in more detail below with the specific examples.

Example 1 is a semiconductor arrangement, comprising: a lower semiconductor chip, an upper semiconductor chip, which is arranged over an upper main side of the lower semiconductor chip, a metallization layer, which is arranged on the upper main side of the lower semiconductor chip, and a bonding material, which fastens the upper semiconductor chip on the lower semiconductor chip, wherein the metallization layer comprises a structure with increased roughness in comparison with the rest of the metallization layer, wherein the structure is arranged along a contour of the upper semiconductor chip.

Example 2 is a semiconductor arrangement according to Example 1, wherein the structure comprises a plurality of depressions.

Example 3 is a semiconductor arrangement according to Example 2, wherein the depressions are holes which extend fully through the metallization layer.

Example 4 is a semiconductor arrangement according to Example 2 or 3, wherein the depressions have an edge length or a diameter in a range of from 0.05 mm to 0.5 mm.

Example 5 is a semiconductor arrangement according to one of the preceding examples, wherein the structure fully encloses the upper semiconductor chip.

Example 6 is a semiconductor arrangement according to one of the preceding examples, wherein wetting the upper main side of the lower semiconductor chip by the bonding material is limited by the structure to a region below the upper semiconductor chip.

Example 7 is a semiconductor arrangement according to one of the preceding examples, wherein the bonding material is an adhesive.

Example 8 is a semiconductor arrangement according to one of the preceding examples, wherein the metallization layer is a metallization of an electrode of the lower semiconductor chip.

Example 9 is a semiconductor arrangement according to one of the preceding examples, wherein the metallization comprises or consists of Cu or Al.

Example 10 is a semiconductor arrangement according to one of the preceding examples, wherein the structure is configured in such a way that there is in the metallization layer a current path through the structure between a region of the metallization layer below the upper semiconductor chip and a region of the metallization layer which lies outside a contour of the upper semiconductor chip.

Example 11 is a semiconductor arrangement, comprising: a lower semiconductor chip, an upper semiconductor chip, which is arranged over an upper main side of the lower semiconductor chip, a metallization layer, which is arranged on the upper main side of the lower semiconductor chip, and a bonding material, which fastens the upper semiconductor chip on the lower semiconductor chip, wherein the metallization layer comprises surface structuring having a plurality of depressions, wherein the surface structuring is arranged along a contour of the upper semiconductor chip.

Example 12 is a semiconductor arrangement according to Example 11, wherein the depressions are arranged relative to one another in such a way that a mutual spacing is not more than two times a diameter or an edge length of the depressions.

Example 13 is a semiconductor arrangement according to Example 11 or 12, wherein the depressions are holes which extend fully through the metallization layer.

Example 14 is a method for producing a semiconductor arrangement, the method comprising: providing a lower semiconductor chip, applying a metallization layer on an upper main side of the lower semiconductor chip, structuring the metallization layer, and fastening an upper semiconductor chip on the upper main side of the lower semiconductor chip by means of a bonding material, wherein the metallization layer is structured in such a way that it has an increased roughness along a contour of the upper semiconductor chip in comparison with the rest of the metallization layer, and wherein wetting of the upper main side of the lower semiconductor chip by the bonding material is limited by the structure to a region below the upper semiconductor chip.

Example 15 is a method according to Example 14, wherein the application of the metallization layer comprises sputtering.

Example 16 is a method according to Example 14 or 15, wherein the structuring of the metallization layer comprises application of a photomask and etching of the metallization layer.

Example 17 is a method according to one of Examples 14 to 16, wherein the fastening of the upper semiconductor chip comprises application of the bonding material on the upper main side by drop application, in such a way that flow of the drop or drops of the bonding material is limited by the structure in the metallization layer.

Example 18 is a method according to one of Examples 14 to 17, wherein the fastening of the upper semiconductor chip comprises arranging the upper semiconductor chip on the bonding material, in such a way that the upper semiconductor chip floats on the bonding material.

Example 19 is a method according to one of Examples 14 to 18, wherein the fastening of the upper semiconductor chip comprises curing the bonding material, wherein the upper semiconductor chip is fixed during the curing by a surface tension exerted by the structure in the metallization layer onto the bonding material.

Example 20 is a device having means for carrying out a method according to one of Examples 14 to 19.

Although specific examples have been represented and described herein, it is clear to the average person skilled in the art that many alternative and/or equivalent implementations may replace the specific examples shown and described, without departing from the scope of the present disclosure. This application is intended to cover all adaptations or variations of the specific examples discussed herein. It is therefore intended for this disclosure to be limited only by the claims and equivalents thereof.

What is claimed is:

1. A semiconductor arrangement, comprising:
   a lower semiconductor chip;
   an upper semiconductor chip arranged over an upper main side of the lower semiconductor chip;
   a metallization layer arranged on the upper main side of the lower semiconductor chip; and
   a bonding material which fastens the upper semiconductor chip on the lower semiconductor chip,
   wherein the metallization layer comprises a structure with increased roughness in comparison with the rest of the metallization layer, the structure being arranged along a contour of the upper semiconductor chip.

2. The semiconductor arrangement of claim 1, wherein the structure comprises a plurality of depressions.

3. The semiconductor arrangement of claim 2, wherein the depressions are holes which extend fully through the metallization layer.

4. The semiconductor arrangement of claim 2, wherein the depressions have an edge length or a diameter in a range of from 0.05 mm to 0.5 mm.

5. The semiconductor arrangement of claim 1, wherein the structure fully encloses the upper semiconductor chip.

6. The semiconductor arrangement of claim 1, wherein wetting the upper main side of the lower semiconductor chip by the bonding material is limited by the structure to a region below the upper semiconductor chip.

7. The semiconductor arrangement of claim 1, wherein the bonding material is an adhesive.

8. The semiconductor arrangement of claim 1, wherein the metallization layer is a metallization of an electrode of the lower semiconductor chip.

9. The semiconductor arrangement of claim 1, wherein the metallization comprises Cu or Al.

10. The semiconductor arrangement of claim 1, wherein the structure is configured such that the metallization layer has a current path through the structure between a region of the metallization layer below the upper semiconductor chip and a region of the metallization layer which lies outside a contour of the upper semiconductor chip.

11. A semiconductor arrangement, comprising:
    a lower semiconductor chip;
    an upper semiconductor chip over an upper main side of the lower semiconductor chip;
    a metallization layer arranged on the upper main side of the lower semiconductor chip; and
    a bonding material which fastens the upper semiconductor chip on the lower semiconductor chip,
    wherein the metallization layer comprises surface structuring having a plurality of depressions,
    wherein the surface structuring is arranged along a contour of the upper semiconductor chip.

12. The semiconductor arrangement of claim 11, wherein the depressions are arranged relative to one another such that a mutual spacing is not more than two times a diameter or an edge length of the depressions.

13. The semiconductor arrangement of claim 11, wherein the depressions are holes which extend fully through the metallization layer.

* * * * *